United States Patent [19]

Beale

[11] 3,775,192

[45] Nov. 27, 1973

[54] METHOD OF MANUFACTURING SEMI-CONDUCTOR DEVICES

[75] Inventor: Julian Robert Anthony Beale, Reigate, England

[73] Assignee: U.S. Philips Corporation, New York, N.Y.

[22] Filed: Dec. 3, 1971

[21] Appl. No.: 204,541

[30] Foreign Application Priority Data

Dec. 9, 1970 Great Britain .................. 58,476/70

[52] U.S. Cl. .................. 148/1.5, 148/175, 148/187, 317/235

[51] Int. Cl. .............................................. H01l 7/54

[58] Field of Search ...................... 148/1.5; 317/235

[56] References Cited

UNITED STATES PATENTS

| | | | |
|---|---|---|---|
| 3,590,471 | 7/1971 | Lepselter et al. | 148/1.5 X |
| 3,558,366 | 1/1971 | Lepselter | 148/1.5 |
| 3,595,716 | 7/1971 | Kerr et al. | 148/187 |
| 3,604,986 | 9/1971 | Lepselter et al. | 317/235 |
| 3,615,875 | 10/1971 | Morita et al. | 148/1.5 |
| 3,660,735 | 5/1972 | McDougall | 148/1.5 X |

OTHER PUBLICATIONS

Fairfield, et al., "Contacting Buried Ion Implanted Layers," IBM Tech. Discl. Bull., Vol. 13, No. 5, Oct. 1970, p. 1052.

*Primary Examiner*—Hyland Bizot
*Assistant Examiner*—J. M. Davis

[57] ABSTRACT

A method is described for making a semiconductor device in which in a hole in an insulating layer on the surface of a semi-conductor is provided a metal layer in a self-registered manner so as to fill the hole and overlap at least on the edge of the insulating layer. Ions are implanted into the semiconductor through the insulator, the metal layer having a much greater masking effect than the insulator on the ions, with the result that the region under the metal layer mask will contain ions to a lesser extent than the region under the insulator.

13 Claims, 13 Drawing Figures

INVENTOR.
JULIAN R. A. BEALE
BY
[signature]
AGENT

INVENTOR.
JULIAN R. A. BEALE
BY
AGENT

INVENTOR.
JULIAN R. A. BEALE

BY

AGENT

INVENTOR.
JULIAN R. A. BEALE
BY
[signature]
AGENT

METHOD OF MANUFACTURING SEMI-CONDUCTOR DEVICES

This invention relates to methods of manufacturing semiconductor devices and further relates to semiconductor devices manufactured by such methods.

In the manufacture of a semiconductor device it is often necessary to provide in a semiconductor body, one surface region of the body of one conductivity type and another surface region of the body of the opposite conductivity type which is surrounded at least at the surface of the body by the one surface region. Often this is achieved by introducing impurity atoms of the one conductivity type into a surface portion of the body, and subsequently introducing a higher concentration of impurity atoms of the opposite conductivity type into part of the surface portion to change the conductivity type of that part so as to form the said other surface region of the said opposite conductivity type, while the surrounding parts of the surface portion are masked against this impurity introduction and form the one surface region of the one conductivity type.

A comparatively high impurity concentration of the one conductivity type is often required in the one surface region surrounding the said other surface region, for example when the one surface region is an extrinsic base region of a bipolar transistor surrounding an emitter region of the opposite conductivity type. In such a case, this comparatively high impurity concentration of the one conductivity type also occurs throughout the said other surface region of the opposite conductivity type, where often it is neither needed nor desirable. To form the said other surface region of the said opposite conductivity type, a higher impurity concentration of the said opposite conductivity type is needed in that part of the body. Thus, this can involve using very high impurity concentrations of the said opposite conductivity type which are otherwise unnecessary, or even involve placing an upper limit on the impurity concentration of the one conductivity type in that part and the surrounding part of the body which may be undesirable from other considerations.

Furthermore, the one surface region may form with the other surface region a p-n junction which terminates at the same semiconductor body surface below an insulating and passivating layer, and a metal layer electrode may contact the said other surface region at an aperture in the insulating layer. In this case, it is often desirable to be able to define the spacing of the termination of the p-n junction from the edge of the aperture without employing an additional mask alignment stage. This is often achieved by using the insulating layer as a diffusion mask and thermally diffusing the higher concentration of the impurity atoms of the opposite conductivity type through the aperture into the semiconductor body to form the said other region, and then by using the same aperture for the metal layer electrode contact. This can be of particular advantage when the surface region contacted by the electrode is small. As a result of the lateral spread of the diffused impurity atoms beneath the edge of the insulating, diffusion masking layer at the aperture, the p-n junction formed terminates usually at the semiconductor body surface below the insulating layer. However, the lateral spacing of the termination of the junction from the edge of the aperture is dependent on the impurity diffusion depth and hence on the depth of the diffused surface region formed. When a shallow surface region is formed in this manner, the said lateral spacing is very small so that the probability of a short-circuit of the junction by the metal layer electrode is increased.

Often it is convenient to implant the impurity atoms of the one conductivity type into the semiconductor body through an insulating layer on the semiconductor body surface to form the one surface region of the one conductivity type. In this case, this insulating layer often acts as a mask in the formation of the other surface region and has an aperture therein through which the impurity atoms of the said opposite conductivity type are introduced into the semiconductor body to form the said other surface region. The implantation is partially masked by such an insulating layer and this results in a structure having a smaller implanted impurity atom penetration in the body below the insulating layer than at the aperture where the other surface region is to be or is provided. Such a structure is often undesirable. Thus, for example, when the one surface region is a base region of a bipolar transistor and the said other surface region is an emitter region, it is often desirable to have a greater penetration of the base region in the extrinsic portion around the emitter region than in the intrinsic portion below the emitter region so as to lower the extrinsic base resistance; furthermore, if the extrinsic portion of the base region is shallower than the intrinsic portion an undesirable structure results in which the width of the active base region between the emitter and collector is less around the edge of the emitter region than directly below the emitter region.

According to the invention, in a method of manufacturing a semiconductor device, an insulating layer with an aperture is provided at a surface of a semiconductor body, a metal layer mask is provided in a self-registered manner on the semiconductor body surface portion at the aperture in the insulating layer and on the edge of the insulating layer at the aperture, and impurity atoms characteristic of the one conductivity type are introduced into the semiconductor body by ion implantation through the insulating layer portion around the metal layer mask, the composition and thickness of the metal layer mask being such that the metal layer mask has a greater effect than the said insulating layer portion in masking the underlying semiconductor body against the said ion implantation so that the major part of the conductivity type determining impurity concentration of one surface region of the body extending around the aperture is provided by the impurity atoms implanted around the metal layer mask and the conductivity type of another surface region of the body at the aperture is determined by an impurity concentration of the opposite conductivity type provided therein.

The metal layer mask need only partially mask the underlying semiconductor body portion against the said ion implantation so that the implanted impurity does penetrate into the semiconductor body below the metal layer mask but such penetration is less than that below the said insulating layer parts around the metal layer mask. In this case, the said one surface region forms part of a region of the one conductivity type which may extend both around the aperture and under the other surface region of the opposite conductivity type formed at the aperture and so have a greater depth in the body around the said other surface region than directly below the said other surface region. Furthermore, the impurity concentration of the one conductivity type provided where the said other surface region is to be or is formed is less than that provided therearound; thus, a structure can be formed in which the one surface region where it extends around the aperture has a conductivity type determining impurity concentration which is higher than the conductivity type determining impurity concentration of an adjacent portion of the said other surface region of the opposite conductivity type.

However, the metal layer mask may have such a composition and thickness that it substantially whooly masks the underlying semiconductor body portion against the said wholly implantation so that there is substantially no penetration of impurity ions into the semiconductor body below the metal layer mask. Such a method can be advantageous in providing certain structures where it is desirable for the impurity concentrations provided or to be provided in the two regions to be determined independently.

The impurity atoms implanted around the metal layer mask provide the major part of the conductivity type determining impurity concentration of the one surface region which extends around the aperture, and have only a very small lateral spread below the edge of the metal layer mask. Thus, the inner edge of the one surface region of the one conductivity type which extends around the aperture is defined in a precise manner by the edge of the metal layer mask. The provision of the metal layer mask in a self-registered manner at the aperture in the insulating layer ensures a well-defined self-registered relationship between the edge of the aperture and the said inner edge of the said one surface region. The inner edge of the said one surface region has the same pattern as the edge of the metal layer mask, and this pattern is similar to and slightly larger than that of the aperture in the insulating layer. The lateral spacing of the inner edge of the one surface region from the edge of the insulating layer at the aperture is determined by the lateral spread of the metal layer mask on the edge of the insulating layer at the aperture; this lateral spread is determined by the process employed in providing the metal layer mask in a self-registered manner, and can be minute in certain cases.

The expression "provided in a self-registered manner" is to be understood herein to mean that the registration is obtained by performing a sequence of operations none of which involve the alignment of one pattern with respect to another pattern within the sequence.

In one form, the metal layer mask is provided by depositing metal on the insulating layer and at the aperture therein and subjecting the body to high frequency acoustic vibrations to remove the metal from the insulating layer except at the aperture therein where the metal remains adhering to the semiconductor body surface portion to form the said metal layer mask. In this form, the lateral spread of the metal layer on the insulating layer is confined to a small lateral spread on an edge portion within the aperture.

In another form, the metal layer mask is provided by electroplating at the semiconductor body surface portion at the aperture in the insulating layer the electroplated metal extending laterally on an adjacent edge portion of the insulating layer. In this form, the lateral spread of the metal layer mask on the insulating layer depends on the thickness of the metal layer mask provided, and is small if the metal layer mask is required to be so thin that it only partially masks against the ion implantation.

In a further form, the aperture in the insulating layer is provided by a photolithographic and etching technique, the same opening in the photoresist pattern being employed to define the aperture in the insulating layer and the metal layer mask in registration therewith. In this form, after providing the aperture in the insulating layer, metal may be deposited, for example form a multi-source evaporator, on the photoresist pattern on the insulating layer and at the said opening therein, after which the photoresist pattern may be removed to breakaway the metal thereon and leave the said metal layer mask at the aperture in the insulating layer and on the edge of the insulating layer at the aperture; in such a case, the lateral spread of the metal layer mask on the insulating layer is confined to a small lateral spread on an edge portion within the aperture. However, the photoresist pattern may be provided on a first metal deposited on the insulating layer, and the aperture in the insulating layer be defined by etching at an opening in the first metal defined by etching at the said opening in the photoresist pattern; subsequently the first metal may be etched further laterally to space the edge of the opening formed in the first metal from the edge of the aperture in the insulating layer, the photoresist pattern be removed and a second metal deposited on the first metal and at the said opening formed therein, and the first metal be removed to breakaway the second metal thereon and leave the said metal layer mask at the aperture in the insulating layer and on the adjacent portion of the insulating layer around the edge of the aperture; in this case, the lateral spread of the metal layer mask on the insulating layer is determined by the lateral etching of the first metal to space the edge of the opening formed in the first metal from the edge of the aperture in the insulating layer; in such a case, the said lateral spread can be comparatively large if required and is independent of the thickness required for the metal layer mask.

Prior to the said ion implantation, a shallow surface layer of the said opposite conductivity type may be provided where the said other surface region and the adjacent portion of the one surface region are to be formed, and, by the said ion implantation, there may be provided in the shallow surface layer where the said adjacent portion of the one surface region are to be formed an impurity concentration of the one conductivity type greater than that of the said opposite conductivity type present therein, the portion of the shallow surface layer where the said other surface region is to be formed being at least partially masked by the metal layer mask against the said ion implantation so as to remain the said opposite conductivity type. In this case, the masked portion of the shallow surface layer of the said opposite conductivity type can provide the impurity concentration of the said opposite conductivity type of the said other surface region at least adjacent the said one surface region of the one conductivity type formed, so that both the lateral extent of the said other surface region and the termination at the surface of the p-n junction formed between the two surface regions are determined by the said ion implantation and hence by the lateral extent of the metal layer mask. Furthermore, such an impurity concentration of the said opposite conductivity type of the said other surface region adjacent the said one surface region is less than the impurity concentration of the one conductivity type in the said one surface region at least adjacent the said other surface region, and the concentration gradient of the said opposite conductivity type across the p-n junction is greater than that of the said one conductivity type.

As mentioned hereinbefore, the edge of the aperture and the said inner edge of the one surface region formed are in a well-defined self-registered relationship both as regards the pattern of each and the lateral spacing between each. The said other surface region of the said opposite conductivity type is formed at the aperture in the insulating layer. This permits the aperture in the insulating layer to be used with advantage in contacting the said other surface region or in providing at least part of the conductivity type determining impurity concentration of the said other surface region.

The one surface region may form with the said other surface region a p-n junction which terminates at the surface of the semiconductor body below the insulating layer, and the aperture in the insulating layer be employed to permit contact between a metal layer electrode provided thereat and the said other surface region. In this case, the termination at the surface of the p-n junction formed can be both well-defined and controllable with respect to the metal layer electrode provided at the opening. Thus, short-circuit of the p-n junction termination by the metal layer electrode can be avoided while the series resistance in the said other surface region between the metal layer electrode and the p-n junction termination is well-defined and controllable.

Either before providing or after removing the metal layer mask at the aperture in the insulating layer, introduction of impurity atoms of the said opposite conductivity type may be effected into the semiconductor body portion at the aperture, for example by thermal diffusion, while the insulating layer masks the underlying semiconductor body portion against the impurity introduction. Such an impurity introduction may enhance the conductivity type determining impurity concentration in the portion of the said other surface region which adjoins the aperture, or may provide the major part of the conductivity type determining impurity concentration in the whole of the said other surface region. In the former case, the enhanced impurity concentration adjoininng the aperture aids the formation of a low resistance ohmic contact at the aperture. In the latter case, the lateral extent of the said other surface region may be determined by this impurity introduction. The said other surface region of the said opposite conductivity type may form a p-n junction with, and be surrounded by, a surface region of the one conductivity type having a lower conductivity type determining impurity concentration which itself is surrounded at the surface by the said one surface region having a high impurity concentration of the one conductivity type. The structure so formed may be a p-n junction diode having electrode contacts to the said one and the said other regions.

The semiconductor device manufactured may be a high frequency bipolar transistor or an integrated circuit comprising a high frequency bipolar transistor, the one surface region extending around the aperture being the extrinsic base region while the said other surface region at the aperture is the emitter region. In this connection, reference is invited to our co-pending Pat. Application, Ser. No. 204,240, filed Dec. 2, 1971, which describes semiconductor devices comprising a semiconductor body having an emitter and a collector region of one conductivity type of a bipolar transistor and a base region of the opposite conductivity type, and further describes methods of manufacturing such semiconductor devices.

Embodiments of the invention will now be described, by way of example, with reference to the diagrammatic drawings which accompanied the Specification, and in which.

Figure 1:
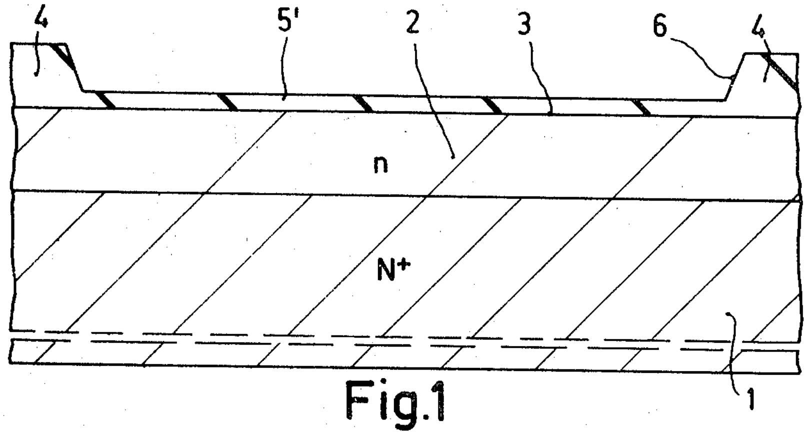
FIGS. 1 to 5 are cross-sectional views of a semiconductor body at various stages in the manufacture of a bipolar transistor.

In the method to be described with reference to FIGS. 1 to 6, the semiconductor device manufactured comprises a bipolar transistor.

The starting material is an n-type monocrystalline silicon body consisting of an n-type substrate 1 which has a resistivity of 0.01 ohm-cm. and a thickness of approximately 200 microns on which is provided by epitaxial growth an epitaxial layer 2 which is of the n-type conductivity and has a resistivity of between 0.5 and 1 ohm-cm. and thickness of 3 microns. The silicon body has its major surfaces normal to the <III> crystal direction.

In general, several discrete bipolar transistors are manufactured from a common semiconductor wafer by forming simultaneously an array of transistor elements and subsequently dividing the wafer to form individual semiconductor bodies for each discrete transistor. However, the method of manufacture described herein with reference to FIGS. 1 to 6 will be in terms of the semiconductor body for one discrete transistor rather than the whole semiconductor wafer. It will be evident that where steps such as photolithographic and etching techniques, diffusion, implantation and annealing are referred to, these operations are effected either simultaneously at a plurality of locations on the wafer or to the whole wafer so that a plurality of individual transistor elements are formed which are separated by dividing the wafer at a later stage of manufacture.

A layer of silicon oxide of approximately 0.6 micron thickness is grown on the surface 3 of the epitaxial layer 2 by maintaining the body at 1,200°C in a stream of wet oxygen. By a photolithographic and etching step, a rectangular opening of approximately 30 microns by 40 microns is formed in the silicon epitaxial layer to expose a surface portion of the underlying n-type eptaxial layer 2 and to form a thick silica layer pattern 4 which defines subsequently the termination of the collector-base p-n junction of the transistor at the surface 3.

By a conventional deposition process, a silica layer 5' having a thickness of 0.2 micron is provided on the exposed body surface portion at the opening in the thick silica layer pattern 4. During the process, the thick silica layer pattern 4 is thickened, and the step 6 between the thick silica layer pattern 4 and the 0.2 micron silica layer 5' is formed. The resulting structure is shown in FIG. 1.

Figure 2:
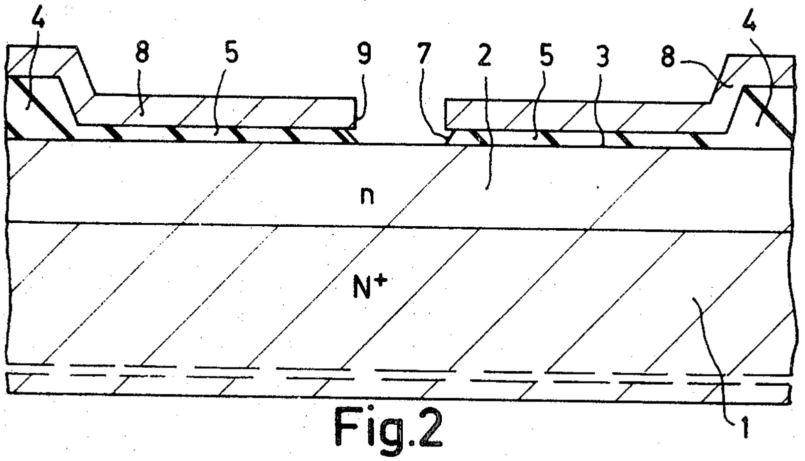

By a photolithographic and etching technique, an aperture which is to form the emitter contact aperture 7 is provided in the silica layer 5'. This is effected in the following conventional manner. A photosensitive layer of photoresist is provided on the thick silica layer pattern 4 and on the thinner silica layer 5' and is exposed to ultra-violet light through a photomask pattern to form in the photosensitive layer a hard polymerised photoresist pattern. Subsequently, the other portions of the photoresist pattern are dissolved to leave the hard, polymerised photoresist pattern 8 on the silica layer 4 and 5'. This photoresist pattern 8 has an opening 9 which corresponds to the aperture 7 provided in the silica layer 5' and at which the silica layer 5' is exposed. By a conventional etching process using the photoresist pattern 8 as an etching mask, the aperture 7 is formed in the silica layer 5'. In this manner a thinner silica layer pattern 5 with an aperture 7 is provided at the surface 3 of the body. The resulting structure is shown in FIG. 2.

Subsequently, a metal layer mask 10 is provided in a self-registered manner at the aperture 7 in the silica layer pattern 5 and on the adjacent edge portion of the silica layer pattern 5 at the aperture 7. This can be effected in a variety of ways.

In one form, before removing the photoresist pattern 8, metal is deposited from a multi-source evaporator in vacuo thereon and at the opening 9 therein. The metal deposited is a flash of nichrome to form a layer having a thickness of approximately 200 A. followed by gold to increase the metal layer thickness to at least approximately 0.1 micron. Subsequently, the photoresist pattern 8 is removed by boiling in acetone to breakaway the metal layer portion thereon and leave the metal layer mask 10 at the aperture 7 in the silica layer pattern 5 and on the edge of the silica layer pattern 5 at the aperture 7.

In another form, after removing the photoresist pattern 8, the metal layer mask 10 is provided by electroplating nickel to a thickness of at least approximately 0.15 micron at the exposed silicon body surface portion at the aperture 7 in the silica layer pattern 5. The n-type silicon body is used as a cathode electrolytic electrode. The electroplated nickel extends laterally on the edge of the silica layer pattern 5 at the aperture 7.

In a further form, after removing the photoresist pattern 8, metal is deposited in vacuo on the silica layer patterns 4 and 5 and on the exposed silicon body surface portion at the aperture 7 in the silica layer pattern 5. The deposited metal is, for example, nickel and forms a metal layer having a thickness of at least approximately 0.15 micron. The resultant structure is heated at approximately 300°C in a mixed atmosphere of nitrogen and hydrogen to ensure satisfactory adhesion between the metal layer and the silicon body surface portion at the aperture 7. Subsequently, the structure is subjected in a water bath to ultrasonic vibrations to remove the metal from the silica layer patterns 4 and 5 except at the aperture 7 in the silica layer pattern 5 where the metal remains adhering to the silicon body surface portion to form the metal layer mask 10. The removal of the metal by this ultrasonic vibratory treatment is found to start at the sharp edges of the silica layer patterns 4 and 5.

Figure 3:
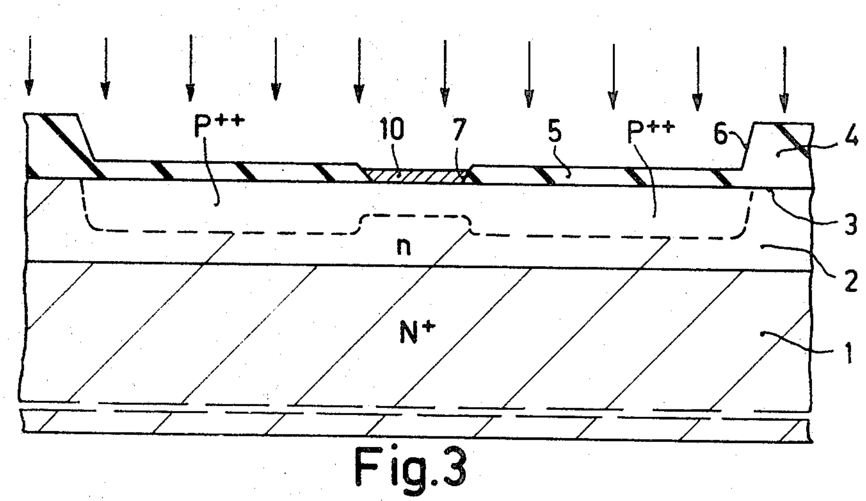

The body is then placed in the target chamber of an ion bombardment apparatus, and, as indicated by arrows in FIG. 3, is bombarded with boron ions having an energy of approximately 100 keV. Orientation of the body is such that there is an angle of 7° between the ion beam axis and the (111) crystal direction.

The boron ions are unable to penetrate through the thick silica layer 4, so that the silicon body portion thereunder is masked against implantation. Boron ions are implanted in the semiconductor body through the portion of the silica layer pattern 5 around the metal layer mask 10. The composition and thickness of the metal layer mask 10 is such that the metal layer mask 10 has a greater effect than the thin silica layer pattern 5 in masking the underlying silicon body against the boron ion implantation so that the boron atoms implanted around the metal layer mask 10 provide the acceptor concentration of one surface region of the body which extends around the aperture 7 and which in the manufactured device forms the extrinsic base region p++ of the transistor.

In FIG. 3, the body portion in which implanted boron atoms predominate is shown in broken outline. As will be seen from FIG. 3, the metal layer mask 10 only partially masks the underlying semiconductor body portion against the said boron ion implantation, and implanted boron atoms do penetrate into the semiconductor body below the metal layer mask 10. However, such penetration into the body is less than that below the silica layer pattern 5 around the metal layer mask 10, and the boron concentration in the portion below the metal layer mask 10 is less than that below the silica layer pattern 5 around the metal mask 10. Thus, the said one surface region p++formed is part of a p-type region formed which extends both around and beneath the aperture 7.

Figure 4:
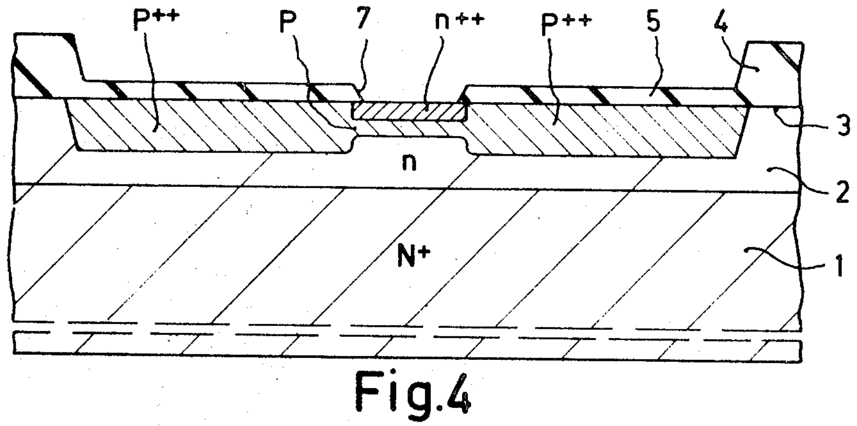
Figure 6:
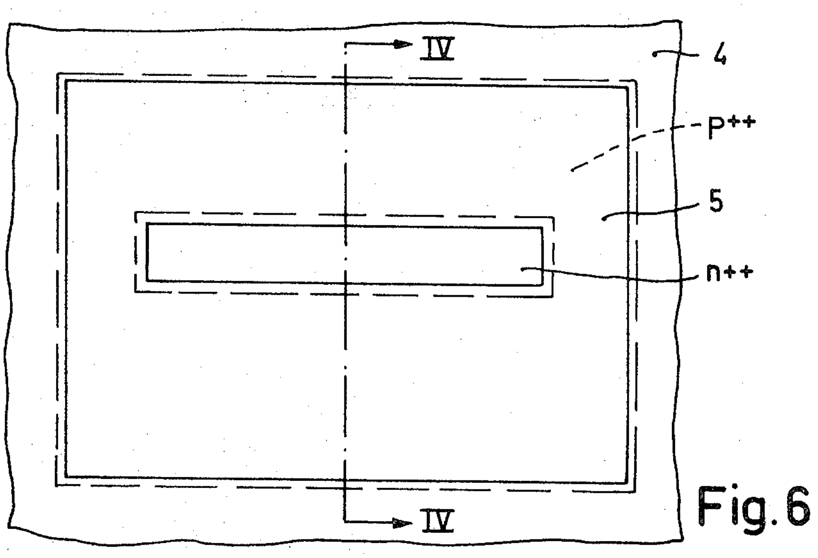
FIG. 6 is a plan view of the semiconductor body at the stage illustrated in FIG. 4.

The metal layer mask 10 is entirely removed by etching to re-expose the silicon body surface portion at the aperture 7 in the silica layer pattern 5. The body is placed in a diffusion furnace and arsenic or phosphorus is diffused into the body at the exposed silicon body surface portion at the aperture 7 while the silica layer patterns 4 and 5 act as a mask against the diffusion. In this manner, a shallow donor impurity concentration is provided adjacent the aperture 7 and has a higher value than the acceptor concentration which was provided thereat by boron ion penetration through the metal layer mask 10. Thus, a diffused n-type surface region is formed at the aperture 7 and constitutes the emitter region n++ of the transistor. The surrounding p-type region constitutes the base region. The resulting structure is shown in FIGS. 4 and 6. The boron concentration which was implanted around the metal layer mask 10 forms the extrinsic base region which surrounds the emitter region n++ at the surface 3. The active base region p below the emitter n++ is provided by the boron concentration implanted through the metal layer mask 10. If a better defined acceptor concentration is required in the active base region p, this can be provided by another acceptor ion implantation after removing the metal layer mask 10 and either after or before diffusing the emitter region concentration n++. The metal layer mask 10 may, in this case, be thick enough to substantially wholly mask the underlying body part against implantation. This other acceptor ion implantation may also be effected at base contact apertures 11 provided in the silica layer pattern 5 as well as at the aperture 7. In this way the acceptor concentration of the extrinsic base is even higher where it is to be contacted.

During the emitter diffusion, annealing and slight diffusion of the implanted concentration occurs. The implanted boron concentration in substitutional lattice positions and the location of the p-n junction formed between the p-type region and the surrounding n-type portion of the epitaxial layer 2 are determined by annealing during this diffusion treatment.

Figure 5:
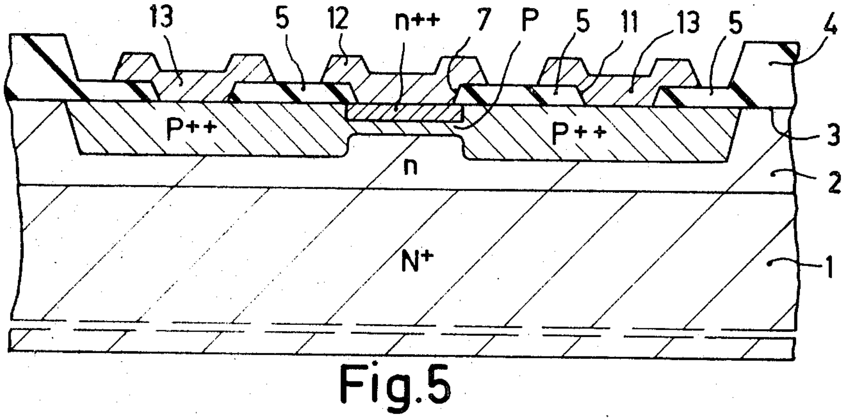

A thin glass layer is formed on the silicon body surface portion at the aperture 7, during the arsenic or phosphorus diffusion. Subsequently, base contact apertures 11 are provided by photolithographic and etching techniques in the silica layer pattern 5, and by a light etching, the thin glass layer is removed. Aluminum is subsequently deposited and its structure defined to form emitter and base contact electrodes 12 and 13 respectively. The resulting structure is shown in FIG. 5. The emitter-base and collector-base p-n junctions terminate at the surface 3 below the silica layer patterns 5 and 4 respectively. Their terminations are shown in broken outline in FIG. 6.

In the manufacture of another bipolar transistor now to be described with reference to FIGS. 7 to 13, the metal layer mask provided in a self-registered manner at an emitter contact aperture in an insulating layer on a semiconductor body surface has a composition and thickness sufficient to mask entirely the underlying semiconductor body portion against ion implantation when forming an extrinsic base region. Furthermore, prior to this ion implantation, the impurity concentrations of the emitter region and active base region are provided in the form of layers which extend laterally across the whole area where the base region is to be formed.

The starting material is an n-type monocrystalline silicon body which is substantially the same as the body of FIG. 1 and consists of an n-type substrate 21 on which is provided an n-type epitaxial layer 22. The surface 23 of the epitaxial layer 22 is normal to the <111> crystal direction.

In general, as with the method of FIGS. 1 to 6, several discrete bipolar transistors are manufactured from a common semiconductor wafer by forming simultaneously an array of transistor elements and subsequently dividing the wafer to form individual semiconductor bodies for each discrete transistor. However, the method of manufacture described herein with reference to FIGS. 7 to 13 will be in terms of the semiconductor body for one discrete transistor rather then the whole semiconductor wafer.

A layer of silicon oxide of approximately 0.6 micron thickness is grown on the surface 23 of the epitaxial layer 22 by maintaining the body at 1,200°C in a stream of wet oxygen. By a photolithographic and etching step, a rectangular opening 24 of approximately 30 microns by 40 microns is formed in the silicon oxide layer to expose a surface portion of the underlying n-type epitaxial layer 22, and to form a thick silica layer pattern 25 which defines subsequently the termination of the collector-base p-n junction of the transistor at the surface 23.

Figure 7:
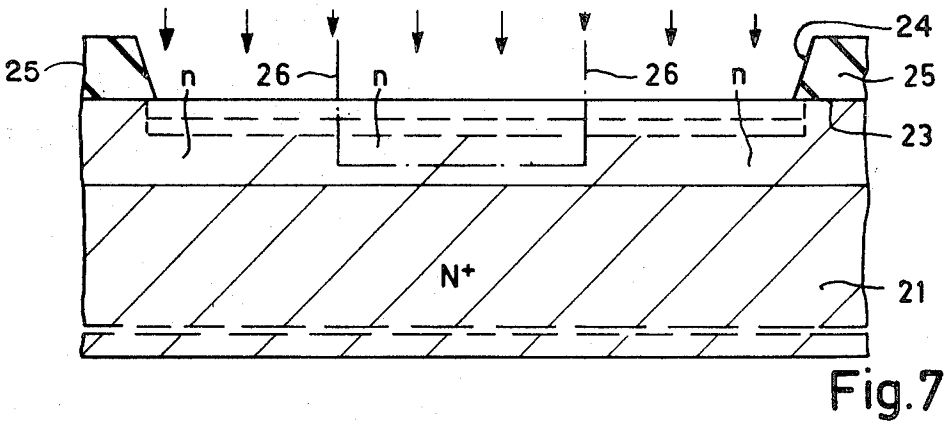
FIG. 7 is a cross-sectional view of a semiconductor body at a stage in the manufacture of a bipolar transistor.
Figure 8:
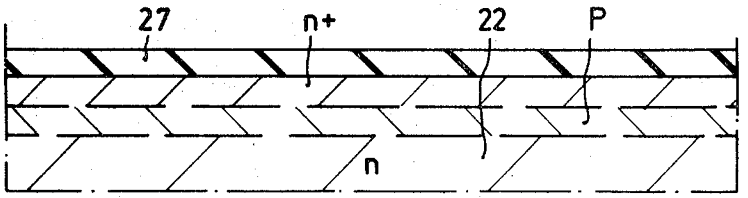
FIGS. 8 to 13 are cross-sectional views of part of the semiconductor body of FIG. 7 at further stages in the manufacture of the bipolar transistor.
Figure 9:
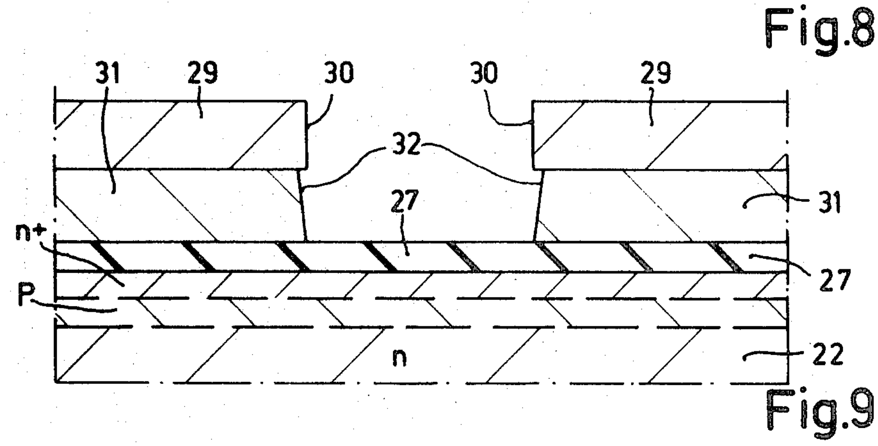
Figure 10:
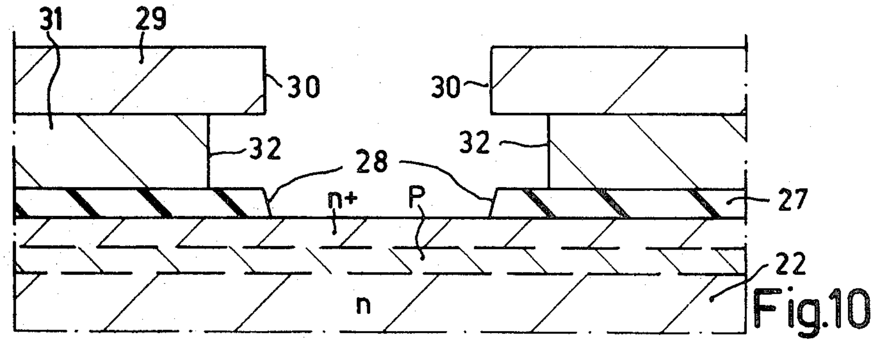

The body is placed in the target chamber of an ion bombardment apparatus and, as indicated by arrows in FIG. 7, is bombarded with boron ions having an energy of approximately 70 keV and subsequently with phosphorus ions having an energy of approximately 100 keV. The orientation of the body is such that there is an angle of 7° between the ion beam axis and the (111) crystal direction; a previous inert ion bombardment may be effected to reduce the tendency of the phosphorus ions to channel.

Both the boron and phosphorus ions are unable to penetrate the thick silica layer pattern 25. Thus, implantation of the boron and phosphorus ions in the body is selective and occurs at the opening 24 in the thick silica layer pattern 25. The implantation is effected such that after a subsequent annealing treatment, the implanted phosphorus ions form a maximum concentration of approximately $5 \times 10^8$ atoms per c.c., the implanted boron ions form a maximum concentration of $2 \times 10^{17}$ atoms per c.c. at a deeper level in the epitaxial layer, and the p-n junction formed therebetween is approximately 0.2 micron from the surface 23.

FIGS. 8 to 13 show at subsequent stages of manufacture only that part of the body which is indicated by the outline 26 in FIG. 7.

The concentration of implanted impurity atoms in substitutional lattice positions and the location of the p-n junction are determined by a subsequent annealing treatment. In this example, this annealing treatment is performed as a late stage in the manufacture of the device. The extent of the regions in which the implanted phosphorus and boron concentrations predominate is shown in broken outline in FIGS. 7 to 12, and these regions are designated by references n+ and p respectively. The region p is in the form of a buried p-type layer which has a maximum boron concentration remote from the surface 23, and which extends laterally further than the active base region to be formed. The region n+ is in the form of a shallow n-type layer adjoining the surface 23 at the surface body portion where the emitter region is to be formed and at the adjacent surface body portion around this emitter surface body portion.

By a conventional deposition process, a silica layer 27 having a thickness of 0.15 micron is provided on the whole exposed body surface portion at the opening 24 in the thick silica layer pattern 25. During the process, the thick silica layer pattern 25 is thickened, and the edge of the thick silica layer pattern 25 at the former opening 24 forms a step with the 0.15 micron silica layer 27.

By photolithographic and etching technique, an aperture which is to form the emitter contact aperture 28 is provided in the silica layer 27. This is effected in the following manner. A first metal, for example aluminum, is deposited on the thick silica layer pattern 25 and on the thinner silica layer 27 to form a first continuous metal layer. A photosensitive layer of photoresist is provided on the first metal layer and is exposed to ultra-violet light through a photomask pattern to form in the photosensitive layer a hard polymerised photoresist pattern. Subsequently, the other portions of the photosensitive layer are dissolved to leave the hard, polymerized photoresist pattern 29 on the first metal layer. This photoresist pattern 29 has an opening 30 which corresponds to the aperture 28 to be provided in the silica layer 27. At this opening 30 in the photoresist pattern 29, the first metal layer is exposed. By a conventional etching process using the photoresist pattern 29 as an etching mask, there is formed in the first metal layer 31 an opening 32 which corresponds to the opening 30 in the photoresist pattern 29 and which exposes the silica layer 27, see FIG. 9. The aperture 28 in the silica layer 27 is then defined by etching at the opening 32 in the first metal layer 31, using an etchant that does not significantly attack the photoresist pattern 29 and the first metal layer 31.

Figure 11:
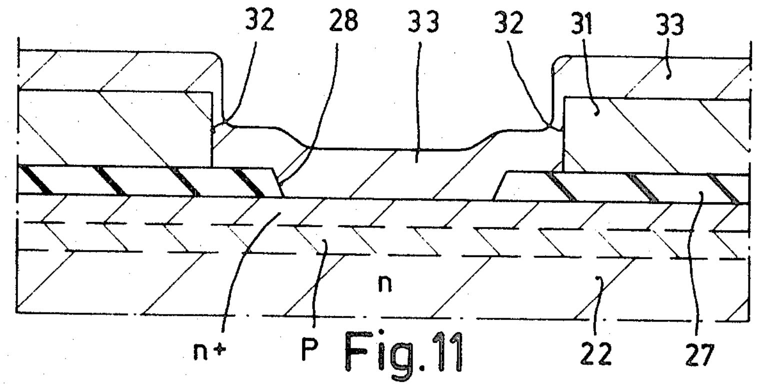

Subsequently, a metal layer mask is provided in a self-registered manner at the emitter contact aperture 28 in the silica layer 27 and on the adjacent edge portions of the silica layer 27 at the aperture 28. This is effected in the following manner. At the opening 30 in the photoresist pattern 29, the first metal layer 31 is etched further laterally to increase the width of the opening therein by approximately 0.6 micron. An etchant is used which does not significantly attack the photoresist pattern 29 and the silica layer 27. The enlarged opening in the first metal layer 31 is designated by reference numeral 32 in FIGS. 10 and 11. In this manner, the edge of the opening 32 formed in the first metal layer 31 on the silica layer 27 is spaced by approximately 0.3 microns from the edge of the emitter contact aperture 28 in the silica layer 27. The photoresist pattern 29 is removed, and a second metal, for example gold, is deposited to form a second metal layer 33 which is situated on the first metal layer 31, on the exposed silica layer portion at the opening 32 in the first metal layer 31, and on the exposed silicon surface portion at the aperture 28 in the silica layer 27. The resulting structure is shown in FIG. 11. Subsequently, the first metal layer 31 is entirely removed by using an etchant which does not significantly attack the second metal layer 33 and the silica layer 27. Removal of the first metal layer 31 causes the second metal layer portions thereon to break away so as to leave the second metal layer portion at the aperture 28 in the silica layer 27 and on the adjacent edge portion of the silica layer 27 around the edge of the aperture 28. This remaining second metal layer portion forms the metal layer mask designated by reference numeral 34 in FIG. 12. The lateral extension *d* of the metal layer mask 34 on the silica layer 27 around the edge of the aperture 28 is approximately 0.3 micron and is determined by the spacing between the edge of the aperture 28 and the opening 32 formed in the first metal layer 31.

Figure 12:
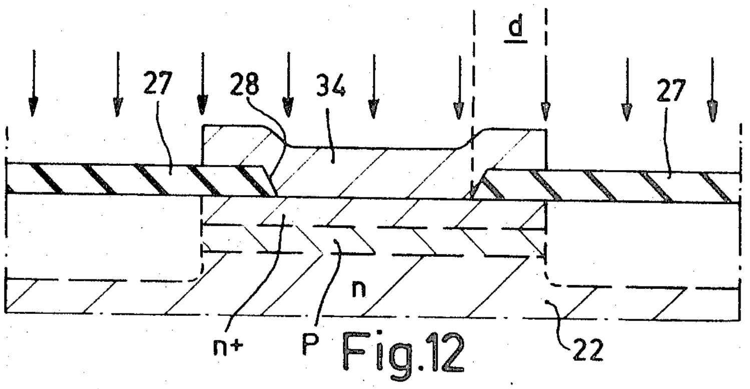

The body is then replaced in the target chamber of the ion bombardment apparatus, and, as indicated by arrows in FIG. 12, is bombarded with boron ions having an energy of approximately 100 keV and at an ion dose of $5 \times 10^{15}$ ions per sq. cm. The same body orientation is employed.

The boron ions are unable to penetrate through either the thick silica layer pattern 25 or through the metal layer mask 34, but able to penetrate the thinner silica layer 27. The surface body portion under the metal layer mask 34 is masked against this boron implantation, and the portion of the surface layer n+ so masked retains its n-type conductivity, and determines the lateral extent of emitter region 35 of the transistor. The boron ions which are implanted through the portions of the silica layer 27 around the metal layer mask 34 form an acceptor concentration in the portions of the shallow layer n+ around the masked portion; the implantation is effected such that this acceptor concentration is considerably higher than the donor concentration present therein so as to change the conductivity type of this portion of the shallow layer n+, to provide the major part of the acceptor concentration of an extrinsic base region p++and to form an emitter-base junction wall 36 with the donor impurity concentration of the masked portion of the shallow layer n+.

After removal of the metal layer mask 34, the body is subjected to an ion bombardment of phosphorus ions having an energy of approximately 20 keV and an ion dose of $2 \times 10^{15}$ ions per sq. cm. These low energy phosphorus ions are unable to penetrate through the silica layers 27 and 25 but are introduced into the surface adjacent part of the emitter n+ portion at the emitter contact aperture 28 and locally enhance the conductivity thereof to form contact portion n++ of the emitter region 35.

The annealing of the hole implanted structure, namely the n++, n+, p and n++ regions is performed at this stage of manufacture at a temperature of approximately 800°C. At this temperature the diffusion of implanted impurity atoms which occurs is not significant.

Figure 13:
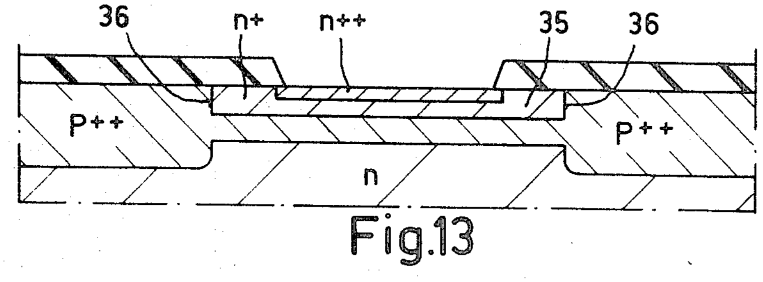

After annealing the structure illustrated in FIG. 13, the manufacturing process is continued as in the preceding method described with reference to FIG. 5. Base contact openings are etched in the silica layer 27 in a conventional manner. Aluminum is deposited to form a layer on the silica layer patterns 27 and 25 and on the exposed silicon surface portions at the emitter and base contact openings. By a conventional photolithographic and etching process, the aluminum layer is defined to form the emitter and base contact electrodes. Subsequently the body is encapsulated and connected in a suitable device envelope.

What we claim is:

1. A method of manufacturing a semiconductor device, comprising providing an insulating layer with an aperture on a surface of a semiconductor body, providing a metal layer mask in a self-registered manner without utilizing an alignment step on the semiconductor body surface portion at the aperture in the insulating layer so as to fill the aperture and overlap at least on the edge of the insulating layer at the aperture, and introducing impurity atoms characteristic of one conductivity type into the semiconductor body by ion implantation through the insulating layer portion around the metal layer mask, the composition and thickness of the metal layer mask being such that the metal layer mask has a greater effect than the said insulating layer portion in masking the underlying semiconductor body portion against the said ion implantation with the result that the major part of the conductivity type determining impurity concentration of one surface region of the body extending around the aperture is provided by the said impurity atoms implanted around the metal layer mask whereas the conductivity type of another surface region of the body at the aperture is determined by an impurity concentration of the opposite conductivity type provided therein during a different step.

2. A method as claimed in claim 1, wherein the metal layer mask is provided by electroplating at the semiconductor body surface portion at the aperture in the insulating layer,.

3. A method as claimed in claim 1, wherein the metal layer mask is provided in a self-registered manner by depositing metal on the insulating layer and at the aperture therein and subjecting the body to high frequency acoustic vibrations to remove the metal from the insulating layer except at the aperture therein where the metal remains adhering to the semiconductor body surface portion to form the said metal layer mask.

4. A method as claimed in claim 1, wherein the aperture in the insulating layer is provided by a photolithographic and etching technique including providing an opening in a photo-resist pattern, the same opening in the photo-resist pattern being employed to define the aperture in the insulating layer and the metal layer mask in registration therewith.

5. A method as claimed in claim 4, wherein after providing the aperture in the insulating layer, the metal mask is provided in a self-registered manner by depositing metal on the photo-resist pattern on the insulating layer and at the said opening therein, after which the photo-resist pattern is removed to break away the metal thereon and leave the said metal layer mask at the aperture in the insulating layer and on the edge of the insulating layer at the aperture.

6. A method as claimed in claim 4, wherein the metal mask is provided in a self-registered manner by providing the photo-resist pattern on a first metal deposited on the insulating layer, the aperture in the insulating layer is defined by etching at an opening in the first metal defined by etching at the said opening in the photo-resist pattern, subsequently the first metal etched further laterally to space the edge of the opening formed in the first metal from the edge of the aperture in the insulating layer, the photo-resist pattern is removed and a second metal is deposited on the first metal and at the said opening formed therein, and the first metal is removed to break away the second metal thereon and leave the said metal layer mask at the aperture in the insulating layer and on the adjacent portion of the insulating layer around the edge of the aperture.

7. A method as claimed in claim 1, wherein prior to the said ion implantation, a shallow surface layer of the said opposite conductivity type is provided where the said other surface region and the adjacent portion of the one surface region are to be formed, and, by the said ion implantation, there is provided in the shallow surface layer where the said adjacent portions of the one surface region are to be formed an impurity concentration of the one conductivity type greater than that of the said opposite conductivity type present therein, the portion of the shallow surface layer where the said other surface region is to be found being at least partially masked by the metal layer mask against the said ion implantation so as to remain the said opposite conductivity type.

8. A method as claimed in claim 1, wherein the one surface region forms with the said other surface region a p-n junction which terminates at the surface of the semiconductor body below the insulating layer, and the aperture in the insulating layer is later employed to receive a metal layer electrode provided thereat to provide a contact to the said other surface region.

9. A method as claimed in claim 1, wherein introduction of impurity atoms of the said opposite conductivity type is effected into the semiconductor body portion at the aperture while the insulating layer masks the underlying semiconductor body portion against the impurity introduced.

10. A method as claimed in claim 9, wherein the said introduction of impurity atoms of the said opposite conductivity type is effected by thermal diffusion to form a p-n junction spaced laterally from the aperture edge.

11. A method as claimed in claim 1 wherein the metal mask acts only to partially mask the underlying semiconductor body whereby there is formed in the body a one surface region containing a less heavily doped one type portion under the metal mask and a more heavily doped extrinsic one type portion surrounding the less heavily doped portion, said other surface region being formed by overdoping a surface portion on the less heavily doped one type portion.

12. A method as claimed in claim 11 wherein a contact is made to the extrinsic portion to serve as a base contact, and a separate contact is made to the overdoped surface portion to serve as an emitter contact.

13. A method as claimed in claim 1 wherein the metal mask is removed after the ion-implantation step to make available again the aperture in the insulating layer.

* * * * *